United States Patent
Andry et al.

(10) Patent No.: US 7,615,405 B2
(45) Date of Patent: *Nov. 10, 2009

(54) METHOD FOR PRECISION ASSEMBLY OF INTEGRATED CIRCUIT CHIP PACKAGES

(75) Inventors: Paul Stephen Andry, Yorktown Heights, NY (US); Leena Paivikki Buchwalter, Hopewell Junction, NY (US); Raymond R. Horton, Dover Plains, NY (US); John Ulrich Knickerbocker, Monroe, NY (US); Cornelia K. Tsang, Mohegan Lake, NY (US); Steven Lorenz Wright, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/872,331

(22) Filed: Oct. 15, 2007

(65) Prior Publication Data

US 2008/0182362 A1    Jul. 31, 2008

Related U.S. Application Data

(63) Continuation of application No. 11/385,121, filed on Mar. 21, 2006, now Pat. No. 7,282,391.

(51) Int. Cl.
*H01L 21/50* (2006.01)
*H01L 21/48* (2006.01)
*H01L 21/44* (2006.01)

(52) U.S. Cl. .................. 438/106; 138/107; 138/108; 138/109; 138/110; 138/125; 257/E21.499; 257/E21.5; 257/E21.505; 257/E21.506; 257/E21.508

(58) Field of Classification Search .......... 257/E21.705, 257/E21.499, E21.5, E21.505, E21.506, E21.508, 257/E21.509, E21.512
See application file for complete search history.

(56) References Cited

U.S. PATENT DOCUMENTS

| | | | |
|---|---|---|---|
| 6,569,710 B1* | 5/2003 | Pierson ..................... 438/110 |
| 2003/0230801 A1* | 12/2003 | Jiang et al. ................. 257/723 |
| 2006/0027934 A1* | 2/2006 | Edelstein et al. ........... 257/774 |
| 2008/0036084 A1* | 2/2008 | Buchwalter et al. ........ 257/738 |

* cited by examiner

*Primary Examiner*—Savitri Mulpuri
*Assistant Examiner*—Mohsen Ahmadi
(74) *Attorney, Agent, or Firm*—Schmeiser, Olsen & Watts; Vazken Alexanian

(57) ABSTRACT

An electronic dive and method of fabricating an electronic device. The method including placing a placement guide over a top surface of a module substrate, the placement guide having a guide opening, the guide opening extending from a top surface of the placement guide to a bottom surface of the placement guide; aligning the placement guide to an integrated circuit chip position on the module substrate; fixing the placement guide to the module substrate; placing an integrated circuit chip in the guide opening, sidewalls of the placement guide opening constraining electrically conductive bonding structures on bottom surface of the integrated circuit chip to self-align to an electrically conductive module substrate contact pad on the top surface of the module substrate in the integrated circuit chip position; and bonding the bonding structures to the module substrate contact pads, the bonding structures and the module substrate contact pads in direct physical and electrical contact after the bonding.

15 Claims, 8 Drawing Sheets

US 7,615,405 B2

METHOD FOR PRECISION ASSEMBLY OF INTEGRATED CIRCUIT CHIP PACKAGES

This application is a continuation application claiming priority to Ser. No. 11/385,121, filed Mar. 21, 2006 now U.S Pat. No. 7,282,391.

This invention was made with Government support under Contract No.: H98230-04-C-0920, NBCH3039004 awarded by DARPA. The Government has certain rights in this invention.

FIELD OF THE INVENTION

The present invention relates to the field of integrated circuit packaging; more specifically, it relates to method and apparatus for precision assembly of integrated circuit packages.

BACKGROUND OF THE INVENTION

Integrated circuit chips are mounted to modules that provide fan out of the interconnections for the next level of assembly. As the size of the interconnections of the integrated circuit chip decrease and the density increases, it becomes more difficult to align the chip pads to the module substrate pads and keep them aligned during the subsequent attachment processes. This problem becomes more difficult when the weight of the integrated circuit chips decrease. Present solutions are costly and time-consuming. Therefore, there is an ongoing need for a method of precision attachment of integrated circuit chips to modules.

SUMMARY OF THE INVENTION

A first aspect of the present invention is a method of fabricating an electronic device, comprising: placing a placement guide over a top surface of a module substrate, a bottom surface of the placement guide facing a top surface of the module substrate, the placement guide having one or more guide openings, the guide openings extending from a top surface of the placement guide to the bottom surface of the placement guide; aligning the placement guide to at least one integrated circuit chip position of one or more integrated circuit chip positions on the module substrate; fixing the aligned placement guide to the module substrate; placing one or more integrated circuit chips in corresponding guide openings of the one or more guide openings, bottom surfaces of the one or more integrated circuit chips facing the top surface of the module substrate, for each of the placed integrated circuit chips, sidewalls of the corresponding placement guide openings constraining electrically conductive bonding structures on bottom surfaces of the placed one or more integrated circuit chips to self-align to corresponding electrically conductive module substrate contact pads on the top surface of the module substrate at corresponding integrated circuit chip positions of the one or more integrated circuit chip positions; and bonding the bonding structures to the module substrate contact pads, the bonding structures and the module substrate contact pads in direct physical and electrical contact after the bonding.

A second aspect of the present invention is an electronic device, comprising a placement guide fixed to a top surface of a module substrate, the placement guide having a guide opening, the guide opening extending from a top surface of the placement guide to a bottom surface of the placement guide; and an integrated circuit chip in the guide opening, bonding structures on a bottom surface the integrated circuit chip in direct physical and electrical contact with corresponding module substrate contact pads on the top surface of the module substrate, a width of the guide opening equal to a corresponding width of the integrated circuit chip plus one half or less a first distance between centers of a first pair of adjacent module substrate contact pads of the module substrate contact pads in a widthwise direction and a length of the guide opening equal to a corresponding length of the integrated circuit chip plus one half or less a second distance between centers of a second pair of adjacent module substrate contact pads of the module substrate contact pads in a lengthwise direction.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
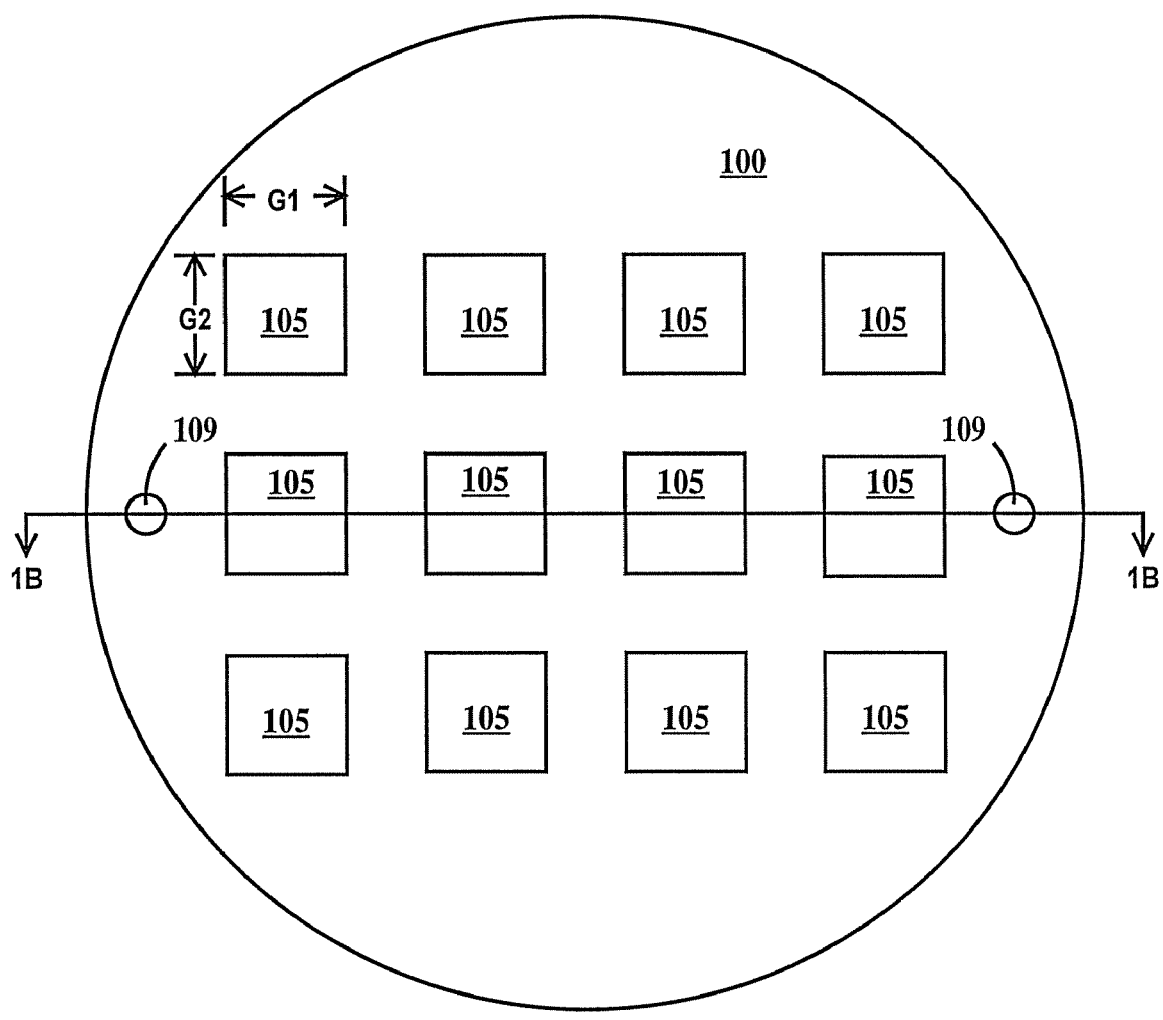
FIG. 1A is a top view and FIG. 1B is a cross-section through line 1B-1B of FIG. 1A illustrating a precision integrated circuit chip placement guide according to embodiments of the present invention.
Figure 1B:
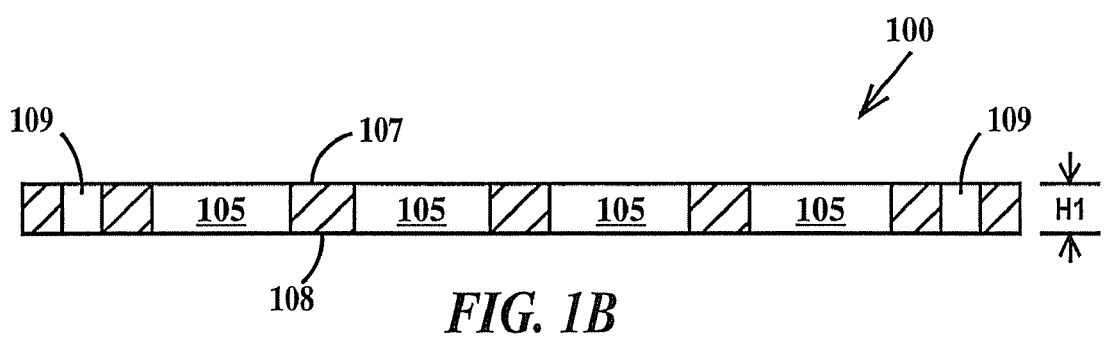

FIG. 1A is a top view and FIG. 1B is a cross-section through line 1B-1B of FIG. 1A illustrating a precision integrated circuit chip placement guide according to embodiments of the present invention. In FIGS. 1A and 1B, a placement guide 100 includes a multiplicity of through guide openings 105 extending from a top surface 107 to a bottom surface 108 of the guide. Top and bottom surfaces 107 and 108 are parallel to each other. Through holes have a length G1 and a width G2. Placement guide 100 has a thickness H1. The values of G1, G2 and H1 are chosen based on the dimensions of the integrated circuit chips that will be placed within guide openings 105 as described infra. Guide openings 105 may be formed using a photolithographic process in combination with wet etching or reactive ion etching (RIE). In one example, guide openings 105 are formed by a deep RIE process. A deep RIE process is an RIE process designed to etch deep opening (e.g. greater than 10 microns) with substantially straight sidewalls relative to top and bottom surfaces 107 and 108 of placement guide 100. Following a process known in the art as the "Bosch Process", a deep RIE processes alternates, up to several times per minute, in situ, between a first process that etches the substrate and a second process that forms polymer on the sidewalls of the opening being etched. After etching is complete, the polymer may be removed with a plasma ash. Placement guide surfaces may be coated with an oxide or a nitride.

Placement guide 100 may advantageously be fabricated from the same material as the substrate used in the fabrication of the integrated circuit chips that will be placed within guide openings 105. In one example, placement guide 100 is fabricated from silicon. In one example, placement guide 100 comprises a silicon disk. In one example H1 is between about 25 microns and about 800 microns.

While a regular pattern of identically sized opening 105 are illustrated in FIG. 1A, different guide openings 105 may be of different sizes (length, width or both length and width) to accommodate different size integrated circuit chips.

Placement guide 100 may include alignment aids as is known in the art. In FIGS. 1A and 1B, placement guide 100 is illustrated with exemplary alignment holes 109 that will mate with alignment pins as described infra. Alignment holes 109 are formed at the same time as guide openings 105 and are defined on the same photomask. Alternatively, alignment holes 109 may be visually aligned to alignment targets as described infra.

Figure 2A:
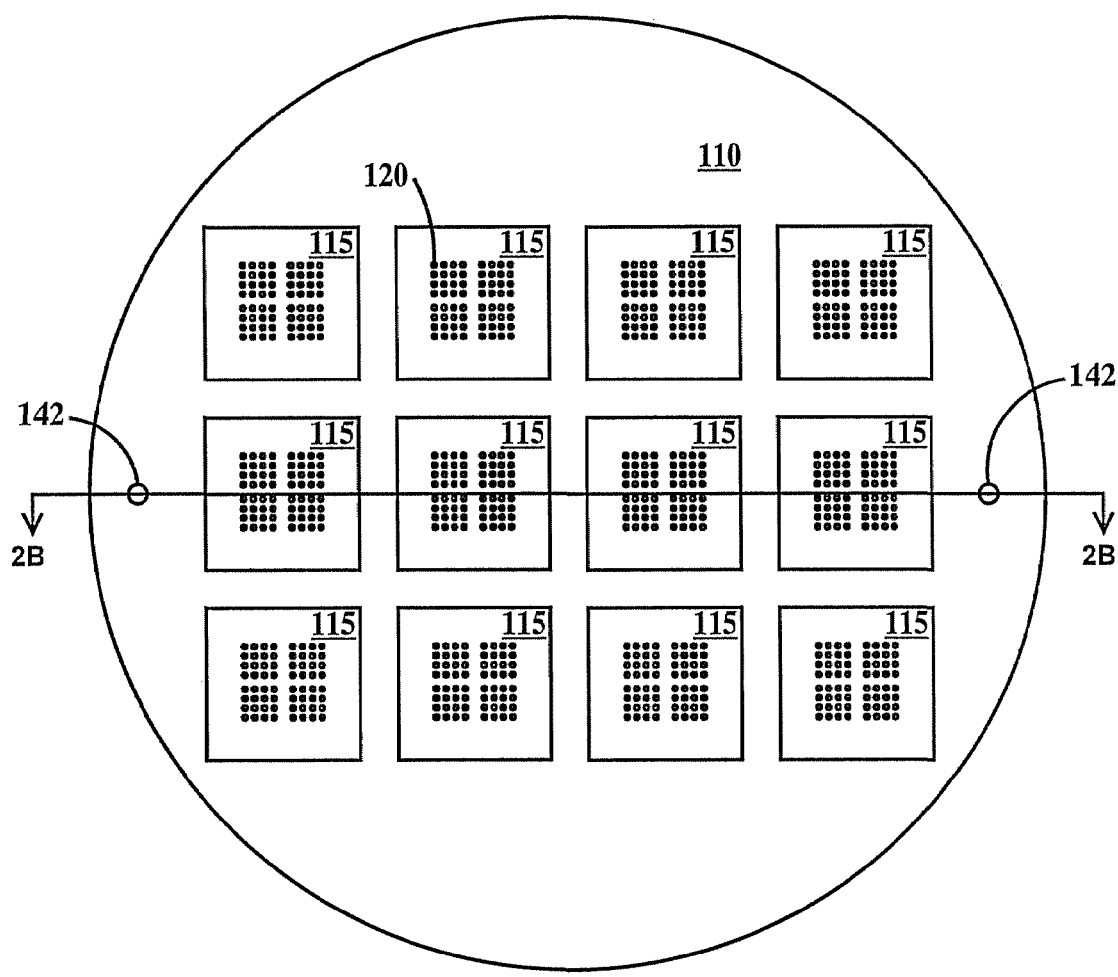
FIG. 2A is a top view and FIG. 2B is a cross-section through line 2B-2B of FIG. 2A illustrating a precision integrated circuit chip module substrate according to embodiments of the present invention.
Figure 2B:
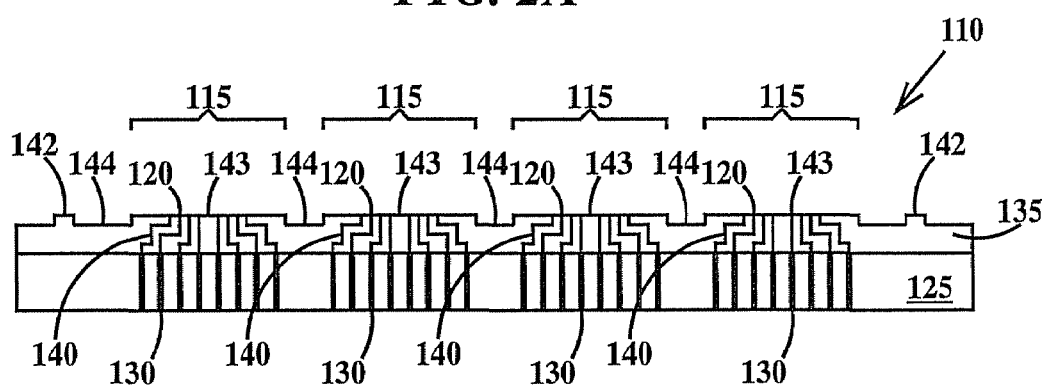

FIG. 2A is a top view and FIG. 2B is a cross-section through line 2B-2B of FIG. 2A illustrating a precision integrated circuit chip module substrate according to embodiments of the present invention. In FIGS. 2A and 2B, a module substrate 110 includes a multiplicity of integrated circuit chip positions 115 having electrically conductive module substrate contact pads 120. Integrated circuit chip positions 115 are positions on module substrate 110 where integrated circuit chips will be electrically bonded. Module substrate 110 includes a substrate layer 125 containing electrically conductive pins 130 and an interconnect layer 135 containing wires 140. Wires 140 electrically connect module substrate contact pads 120 to pins 130. In one example, module substrate contact pads 120 comprise copper, tungsten, tantalum, aluminum or combinations thereof. Interconnect layer 135 may contain two or more interconnected wiring levels 125. Details of substrate layer 125 and interconnect layer 135 are described infra in relationship to FIG. 20. Module substrate 110 has a thickness H2.

Module substrate 110 may comprise silicon wafers having one or more wiring levels, ceramic substrates having one or more wiring levels or organic substrates (i.e. printed circuit boards, flexible circuit boards, fiberglass circuit boards, plastic boards) having one or more wiring levels. Module substrate 110, though illustrated with front to backside connections may have frontside contact pads instead of pins 130. In one example, pins 130 may extend past the backside of module substrate 110. In one example, pins 130 may have copper or solder balls fixed thereto for attachment to module sockets.

Module substrate 110 may advantageously be fabricated from the same material as the substrate used in the fabrication of the integrated circuit chips that will be placed within guide openings 105 of placement guide 100 (see FIGS. 1A and 1B). In one example, module substrate 110 is fabricated from silicon. In one example, module substrate 110 comprises a silicon disk. In one example H2 is between about 25 microns and about 800 microns. Module substrate 110 may advantageously be fabricated using the same processes used to fabricate integrated circuit chips.

Module substrate 110 may include alignment aids as is known in the art. In FIGS. 2A and 2B, module substrate 110 is illustrated with exemplary alignment pins 142 that will mate with alignment holes 109 (see FIGS. 1A and 1B). Alternatively, instead of alignment pins, module substrate 110 may include alignment targets that may be aligned to alignment marks on alignment guide 100 or through holes in alignment guide 100 (see FIGS. 1A and 1B) and which may be held in place by clamping or adhesive or alternate method known in the art. In FIG. 2B, integrated circuit chip positions 115 include plateaus 143 separated by recessed regions 144 of interconnect layer 135.

Figure 3:
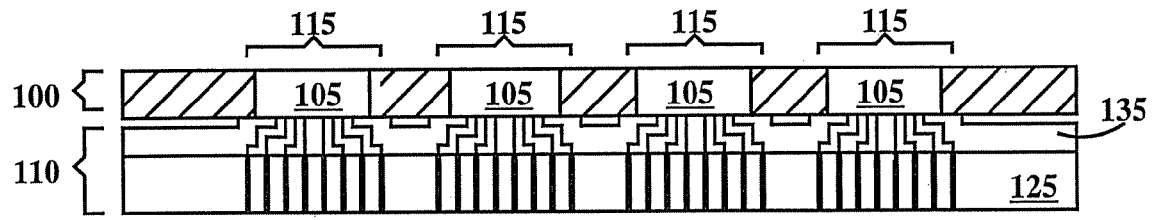
FIGS. 3 through 7 are cross-sectional views through line 1B-1B of FIG. 1A and line 2B-2B of FIG. 2A illustrating fabrication of precision aligned integrated circuit modules according to a first embodiment of the present invention.

FIGS. 3 through 7 are cross-sectional views through line 1B-1B of FIG. 1A and line 2B-2B of FIG. 2A illustrating fabrication of precision aligned integrated circuit modules according to a first embodiment of the present invention. In FIG. 3, placement guide 100 is aligned over module substrate 110 so guide openings 105 are precision aligned over integrated circuit chip positions 115. Precision alignment of placement guide 100 to module substrate 110 is described infra in reference to FIG. 18. Since there are a variety of alignment methodologies known in the art that may be used, no alignment structures are illustrated in FIG. 3. Alignment schemes that may be used to align placement guide 100 to module substrate 110 include, but are not limited to, using alignment targets and marks with visual or infrared optics in combination with precision tooling and/or image recognition software for optimization of X, Y and rotational alignment. After alignment, placement guide 100 is permanently or removeably attached (fixed) to module substrate 110 using any number of schemes known in the art, including, but not limited to, mechanical clamping with and without alignment pins and adhesive attachment with and without alignment pins.

Figure 4:
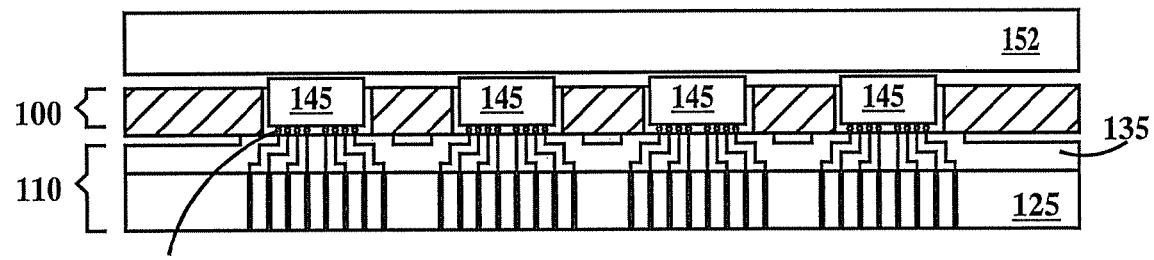

In FIG. 4, integrated circuit chips 145 having electrical/mechanical bonding structures 150 are placed into openings 105 (see FIG. 3). Examples of bonding structures include, but are not limited to, metal pads, copper pads and solder bumps. Bonding structures 150 self-align to module substrate contact pads 120 (see, for example, FIG. 20) because of the precision alignment of placement guide 100 to module substrate 110 and the size of guide openings 105 (see FIG. 3). Next, an electromechanical bond between module substrate contact pads 120 and bonding structures 150 is formed. An optional weight 152 may be placed over integrated circuit chips 145 to aid in the bonding process. When bonding structures are solder bumps, the assembly may be heated to reflow the solder bumps in a inert or reducing gas such as nitrogen or nitrogen and hydrogen mixture, respectively to minimize solder or pad oxidation. An optional fluxing gas such as formic acid may be added to the inert or reducing gas used during reflow to enhance joining. When the bonding structures and module substrate contact pads include terminal layers of copper, a copper to copper weld may be formed, for example, by heating the assembly to between about 350° C. and about 450° C. under about 100 pounds per square inch of pressure in the presence of an inert gas (i.e. nitrogen, argon or helium) or and inert gas (i.e., nitrogen, argon or helium) / reducing gas (i.e., hydrogen) mixture. When the bonding structures and module substrate contact pads include terminal layers of gold, a gold to gold weld may be formed, for example, by heating the assembly to between about 350° C. and about 450° C. under about 100 pounds per square inch of pressure in the presence of air or an inert gas, or with the aide of an ultrasonic bonding force. The former solder and gold bonding processes are also known in the art as a chip attaching process, simply chip attach, reflow, assembly or ultrasonic bonding.

Figure 5:
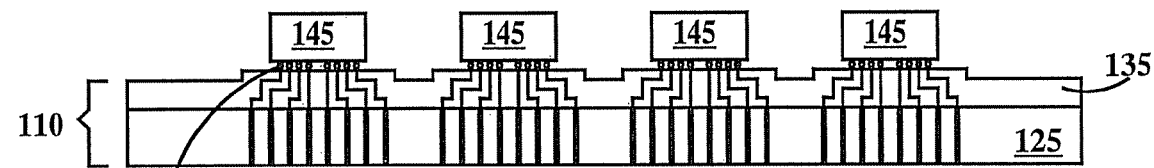
Figure 6:
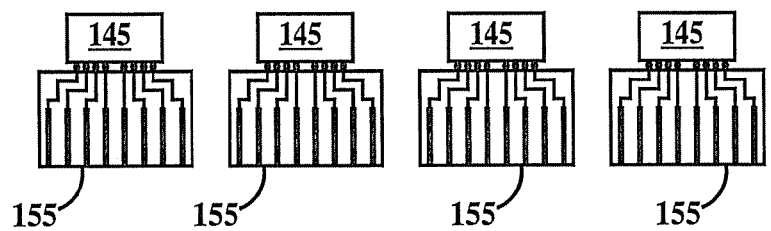

In FIG. 5, placement guide 100 (see FIG. 4) is removed and in FIG. 6, module substrate 110 (see FIG. 5) is singulated (i.e. by mechanical dicing, laser dicing, wet etching, RIE, or mechanical fracturing) into individual modules 155 each including a single integrated circuit chip 145.

Figure 7:
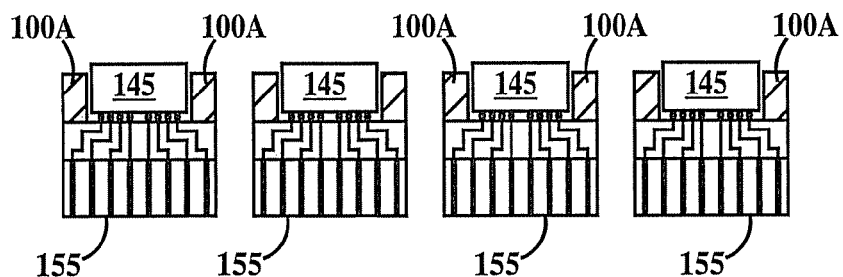

Alternatively, placement guide 100 (see FIG. 4) is not removed and in FIG. 7, module substrate 110 (see FIG. 5) is singulated (i.e. by mechanical dicing, laser dicing, wet etching, RIE, or mechanical fracturing) into individual modules 155 each including a single integrated circuit chip 145 surrounded by a portion of placement guide 100A. In the case placement guide 100 (see FIG. 3) is not removed, all exposed surfaces of the placement guide and exposed interconnections may be coated with a dielectric film, covered by a dielectric layer or all exposed interconnections encapsulated with an adhesive/sealant such as is known in the art as "chip underfill" or "wafer to wafer bonding adhesive". The encapsulation may enhance module substrate mechanical properties and minimize interconnection corrosion or degradation. Thus, direct physical contact between integrated circuit chip 145 and portion of placement guide 100A will not result in electrical shorting of the integrated circuit chip to the placement guide or of the placement guide to the module substrate and the assembly can achieve improved manufacturability/handling and product or application reliability.

Figure 8:
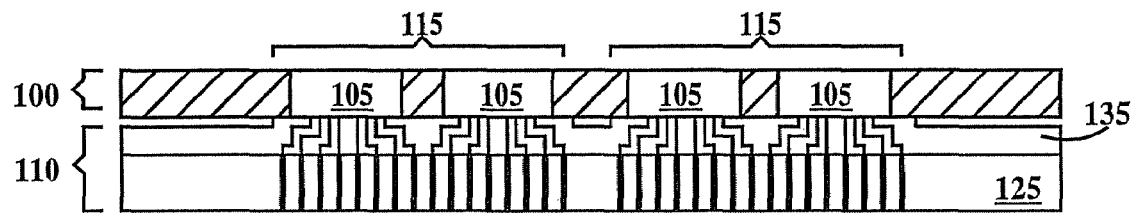
FIGS. 8 through 12 are cross-sectional views through line 1B-1B of FIG. 1A and line 2B-2B of FIG. 2A illustrating fabrication of precision aligned integrated circuit modules according to a second embodiment of the present invention.
Figure 9:
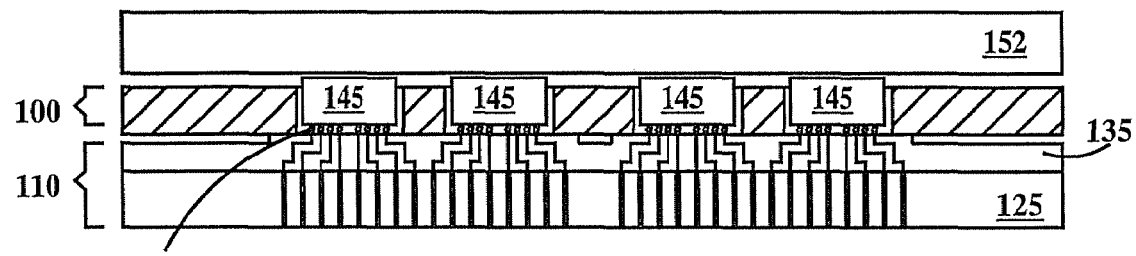
Figure 10:
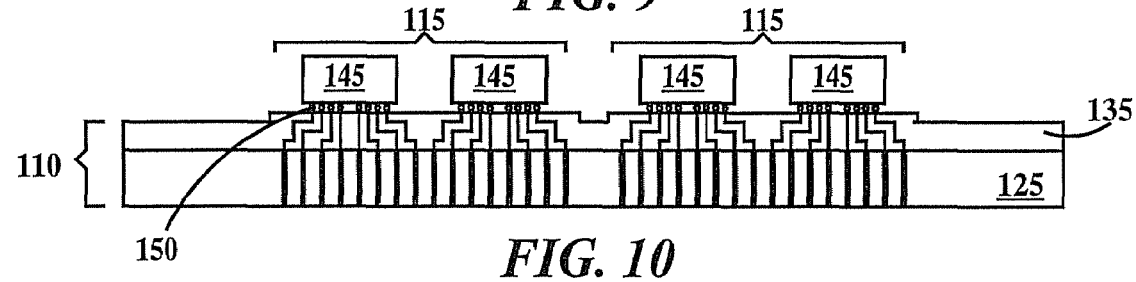

FIGS. 8 through 12 are cross-sectional views through line 1B-1B of FIG. 1A and line 2B-2B of FIG. 2A illustrating fabrication of precision aligned integrated circuit modules according to a second embodiment of the present invention. FIGS. 8, 9 and 10 are similar to respective FIGS. 3, 4 and 5 except in FIGS. 8, 9 and 10, integrated circuit chip positions 115 are designed to interconnect to more than one integrated circuit chip 145. However, each integrated circuit chip 145 is still within a guide opening 105.

Figure 11:
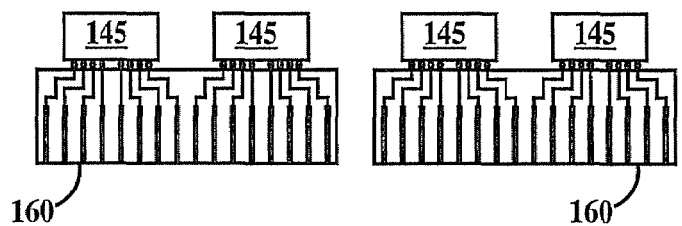

In FIG. 11, module substrate 110 (see FIG. 10) is singulated (i.e. by mechanical dicing, laser dicing, wet etching, RIE, or mechanical fracturing) into individual modules 155 each including a two or more integrated circuit chips 145.

Figure 12:
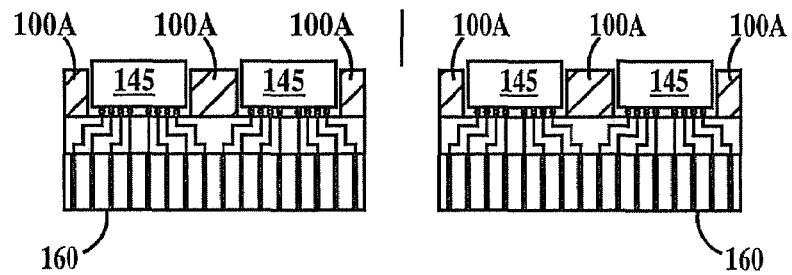

Alternatively, placement guide 100 (see FIG. 9) is not removed and in FIG. 12, module substrate 110 (see FIG. 10) is singulated (i.e. by mechanical dicing, laser dicing, wet etching, RIE, or mechanical fracturing) into individual modules 155 each including two or more integrated circuit chips 145, each chip surrounded by and separated from each other by a portion of placement guide 100A.

Figure 13:
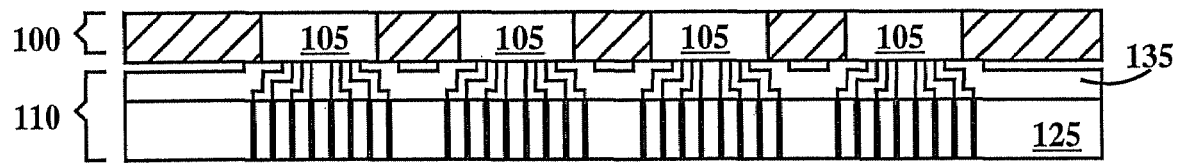
FIGS. 13 through 17 are cross-sectional views through line 1B-1B of FIG. 1A and line 2B-2B of FIG. 2A illustrating fabrication of precision aligned integrated circuit modules according to a third embodiment of the present invention.
Figure 14:
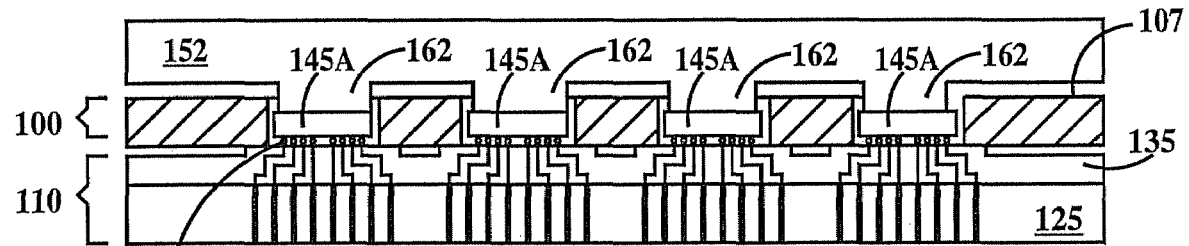
Figure 15:
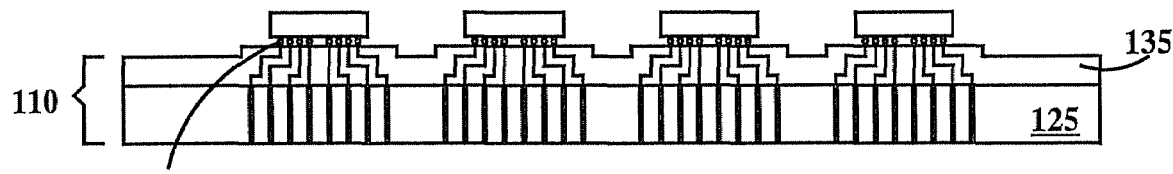

FIGS. 13 through 17 are cross-sectional views through line 1B-1B of FIG. 1A and line 2B-2B of FIG. 2A illustrating fabrication of precision aligned integrated circuit modules according to a third embodiment of the present invention. FIG. 13 is the same as FIG. 3 and FIGS. 14 and 15 are similar to respective FIGS. 4 and 5 except in FIGS. 14 and 15, integrated circuit chips 145A are thinner than integrated circuit chips 145 of FIG. 5 and thus do not extend above top surface 107 of placement guide 100 (see FIG. 14). Therefore, optional weight 152 includes protruding regions 162 extending into guide opening 105 (see FIG. 13) and contacting integrated circuit chips 145.

Figure 16:
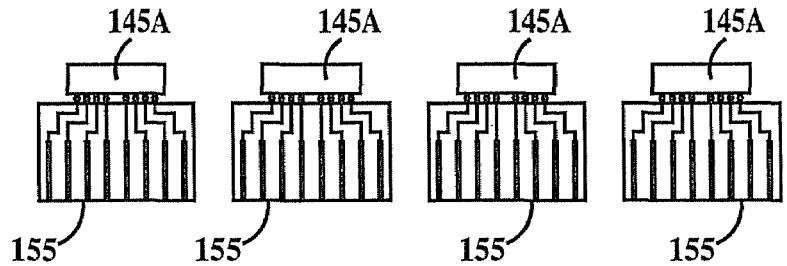

In FIG. 16, module substrate 110 (see FIG. 15) is singulated (i.e. by mechanical dicing, laser dicing, wet etching, RIE, or mechanical fracturing) into individual modules 155 each including a two or more integrated circuit chips 145.

Figure 17:
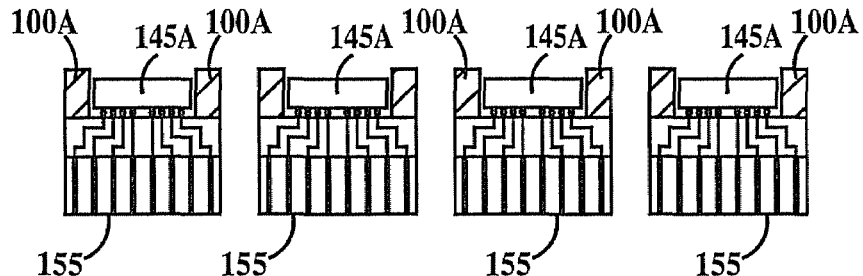

Alternatively, placement guide 100 (see FIG. 14) is not removed and in FIG. 17, module substrate 110 (see FIG. 15) is singulated (i.e. by mechanical dicing, laser dicing, wet etching, RIE, or mechanical fracturing) into individual modules 155 each including one integrated circuit chip 145 surrounded by and separated from each other by a portion of placement guide 100A.

Other embodiments of the present invention include, mounting two or more thin chips on the same module substrate, mounting a combination of thick and thin chips on the same module substrate, mounting different (width, length or both width and length) sized chips on the same module substrate, and mounting one or more stacked chips on the same module substrate and combinations thereof.

Figure 18:
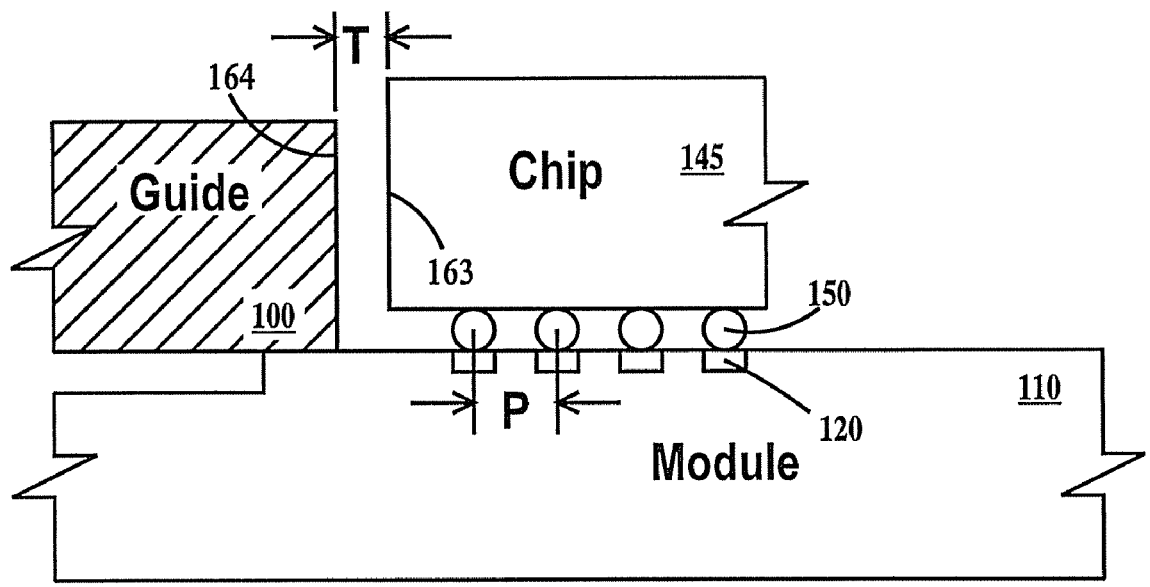
FIG. 18 is cross-section of an integrated circuit guide, an integrated circuit chip and an integrated circuit module assembly illustrating the alignment tolerances of the chip to the module substrate according to the embodiments of the present invention.

FIG. 18 is cross-section of an integrated circuit guide, an integrated circuit chip and an integrated circuit module assembly illustrating the alignment tolerances of the chip to the module according to the embodiments of the present invention. In FIG. 18, bonding structures 150 and module substrate contact pads 120 have a pitch P. Sidewalls 163 of integrated circuit chip 145 are separated from opposing sidewalls 164 of placement guide 100 by a distance T. In one example, T is equal or less than 0.5*P. If the opposing sidewalls are not parallel to each other, then T is the value of the smallest distance between the opposing sidewalls (see for example, FIG. 19B). Note, the pitch P for different integrated circuit chip positions 115 (see FIG. 2A) can be different. If an integrated circuit chip has a length C1 and a width C2, then (referring to FIG. 1A), G1 is less than or equal to C1+0.5*P and G2 is less than or equal to C2+0.5*P. It should be understood that there are two pitches in a rectangular integrated circuit, a pitch in the widthwise direction and a pitch in the lengthwise direction. These pitches may or may not be the same. Thus, the distance T in the widthwise ($T_W$) direction may be different from the distance T in the lengthwise direction ($T_L$). Alternatively, the smaller value of $T_W$ and $T_L$ may be used in both the lengthwise and widthwise directions.

Figure 19A:
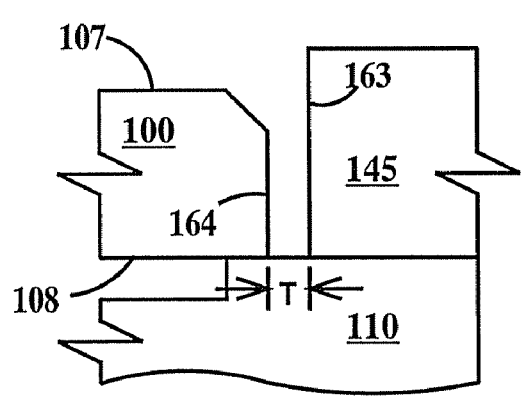
FIGS. 19A through 19D are cross-sectional views illustrating details of the edges integrated circuit placement guides and integrated circuit chips according to embodiments of the present invention.
Figure 19B:
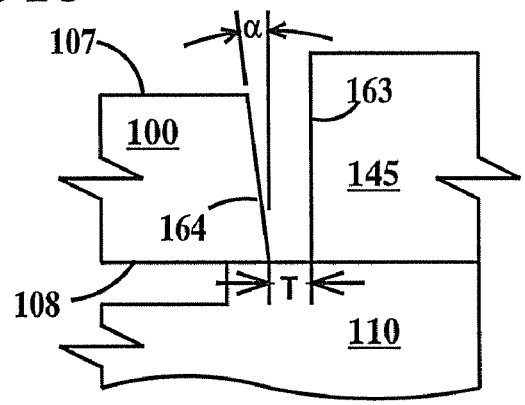

FIGS. 19A through 19D are cross-sectional views illustrating details of the edges integrated circuit placement guides and integrated circuit chips according to embodiments of the present invention. In FIG. 19A, the corner formed by top surface 107 and top edge of sidewall 164 of placement guide 100 has been chamfered. In FIG. 19B, the entire sidewall 164 from top surface 107 to bottom surface 108 of placement guide 100 is tapered at an angle α. A first distance (T) from the edge formed by sidewall 164 and bottom surface 108 to sidewall 163 being smaller than a second distance from the edge formed by sidewall 164 and top surface 107 to sidewall 163. In one example α is between about 1° and about 9°. In another example a is between about 1° and about 45°.

Figure 19C:
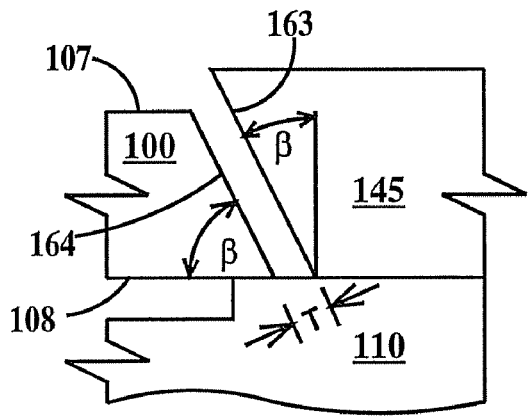

In FIG. 19C, the entire sidewall 164 from top surface 107 to bottom surface 108 of placement guide 100 is tapered at an angle β measured between sidewall 164 and bottom surface 108. The entire sidewall 163 of integrated circuit chip 145 is likewise tapered at the angle β, however, sidewalls 163 and 164 are parallel and spaced distance T apart. In one example β is between about 1° and about 45°. Because integrated circuit chip 145 overlays placement guide 100 the placement guide cannot be removed from module substrate 110.

Figure 19D:
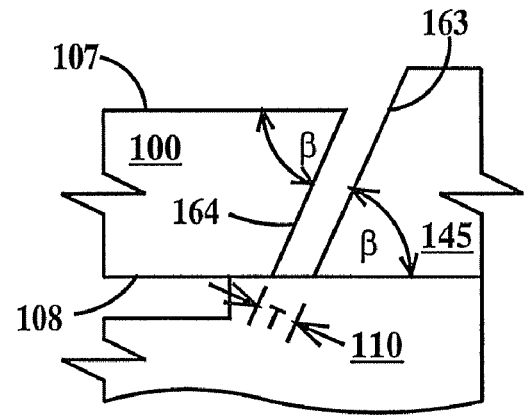

In FIG. 19D, the entire sidewall 164 from top surface 107 to bottom surface 108 of placement guide 100 is tapered at an angle β measured between sidewall 164 and top surface 107. The entire sidewall 163 of integrated circuit chip 145 is likewise tapered at the angle β, however, sidewalls 163 and 164 are parallel and spaced distance T apart. Because placement guide 100 overlays integrated circuit chip 145 the integrated circuit chip must be placed on module substrate 110 before the placement guide is placed on the module substrate.

While only one edge of placement guide 100 and one edge of integrated circuit chip 145 have been illustrated in FIGS. 19A, 19B, 19C and 19D, it should be recognized that all edges of the placement guide and all edges of the integrated circuits may be the same as the single edges illustrated in FIGS. 19A, 19B, 19C and 19D.

Figure 20:
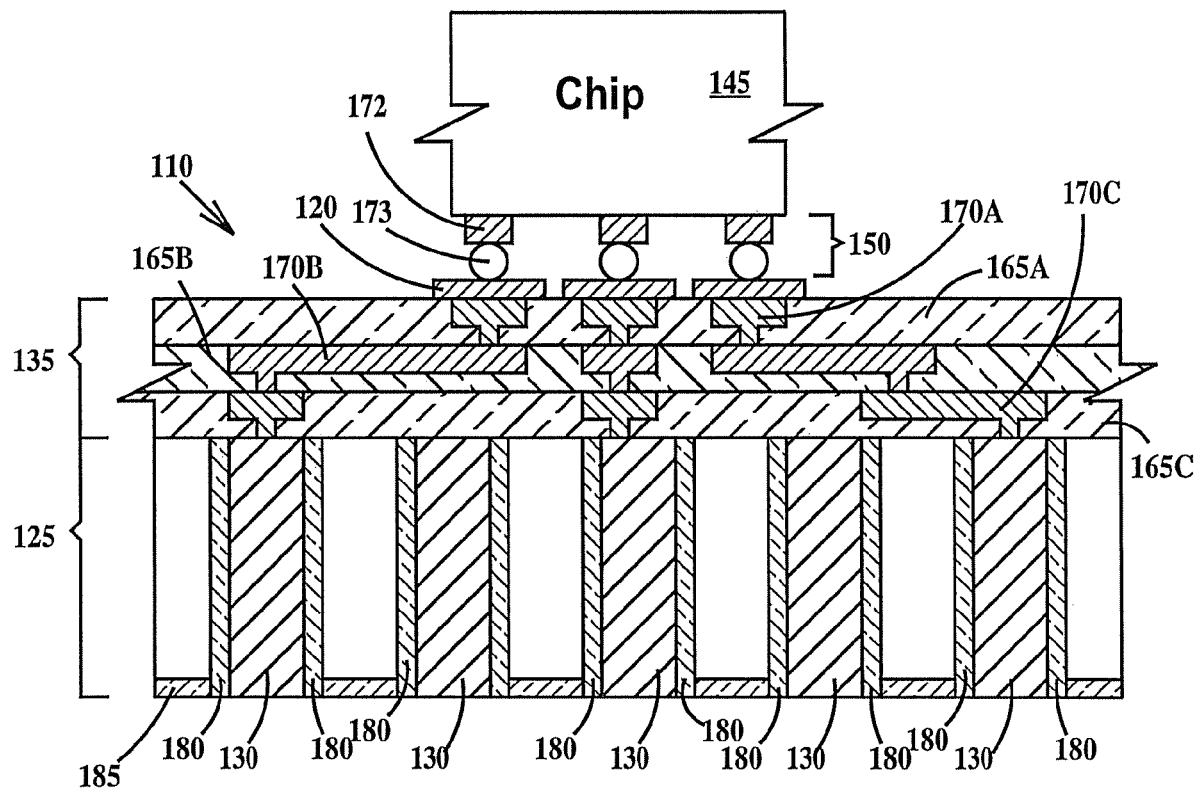
FIG. 20 is a cross-section of an exemplary integrated circuit chip mounted to an exemplary integrated circuit module according to embodiments of the present invention.

FIG. 20 is a cross-section of an exemplary integrated circuit chip mounted to an exemplary integrated circuit module according to embodiments of the present invention. In FIG. 20, interconnect layer 135 of module substrate 110 includes first, second and third dielectric layers 165A, 165B and 165C containing respective damascene wires and vias 170A, 170B and 170C. Wires 170A, 170B and 170C electrically connect module substrate contact pads 120 to electrically conductive pins 130 in substrate layer 125. Pins 130 are isolated from each other and from substrate layer 125 by dielectric layers 180 and 185. In FIG. 20, bonding structures 150 include chip contact pads 172 on which solder bumps 173 (or solder balls) have been formed. In one example solder bumps comprise a mixture of lead and tin. Chip contact pads 120 may comprise layers of chrome, gold, nickel, copper, tungsten, tantalum, titanium, and aluminum. A common name for these layers is ball-limiting metallurgy (BLM). This structure produces a solder connection, also know as a controlled-chip-collapse-connection (C4). Alternatively, bonding structures 150 may consist only of chip contact pads 172, both the chip contact pads and module substrate contact pads 120 having at least outer layers of copper. This structure produces a copper-to-copper bond. Alternatively, bonding structures 150 may consist only of chip contact pads 172, both the chip contact pads and module substrate contact pads 120 having at least outer layers of gold where the structure produces a gold-to-gold bond.

Figure 21:
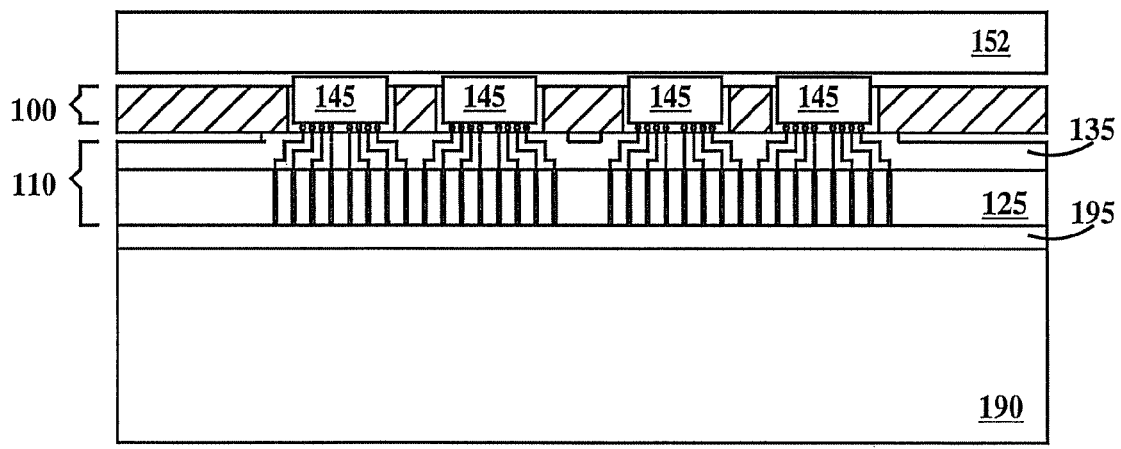
FIG. 21 is a cross-section of an integrated circuit chip and an integrated circuit module assembly utilizing a handle substrate.

FIG. 21 is a cross-section of an integrated circuit chip and an integrated circuit module assembly utilizing a handle substrate 190. In cases where module substrate 110 is thin and fragile, handle substrate 190 is temporarily attached to substrate layer 125 by an adhesive 195 in order to prevent breakage of the module substrate during aligning, clamping, singulation and bonding processes.

Figure 22:
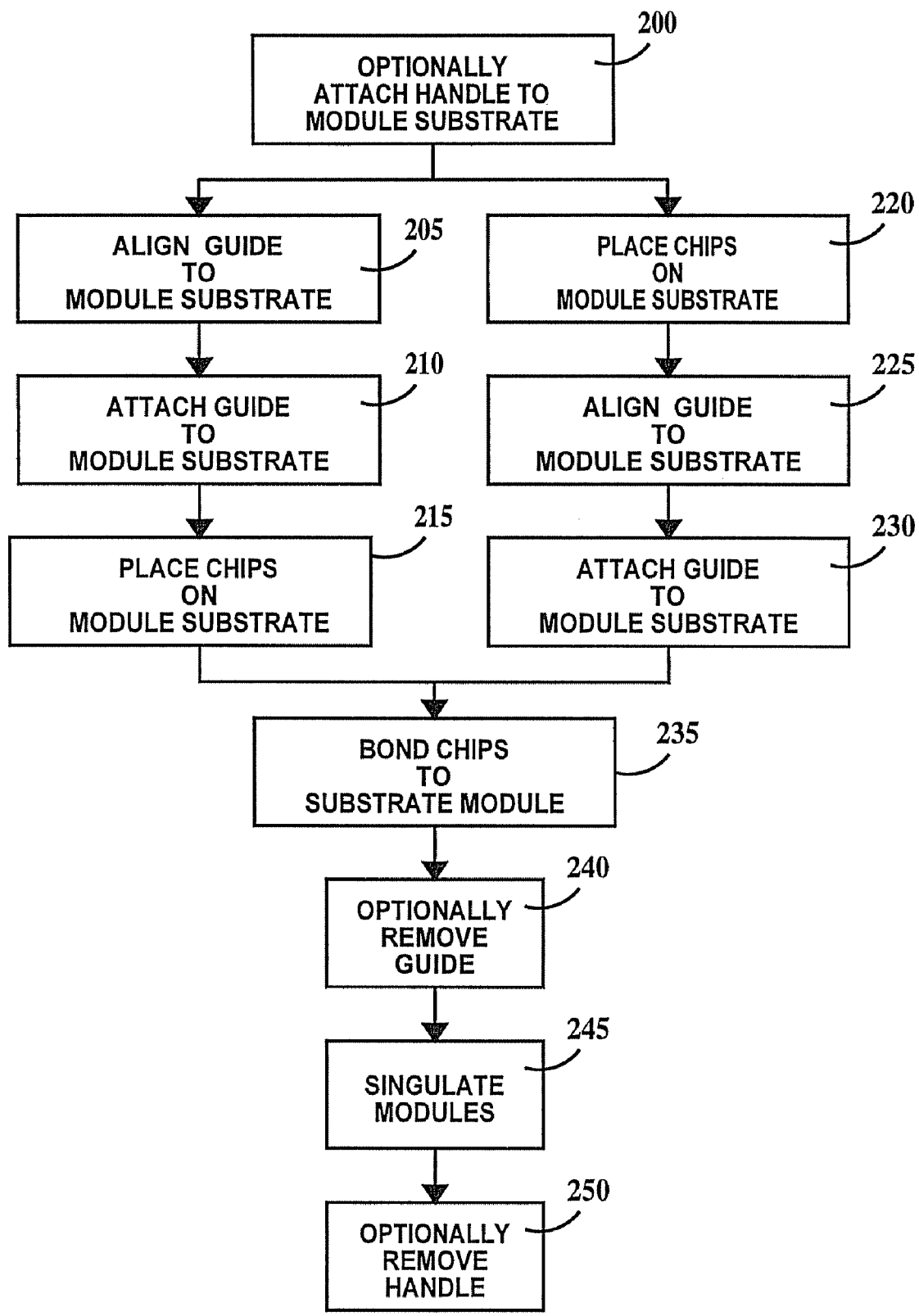
FIG. 22 is a flowchart of the methodology of fabricating precision aligned integrated circuit modules according to embodiments of the present invention.

FIG. 22 is a flowchart of the methodology of fabricating precision aligned integrated circuit modules according to embodiments of the present invention. In step 200, a handle substrate is optionally attached to a module substrate. After step 200 the method can proceed through either steps 205, 210 and 215 or through steps 220, 225 and 230.

In step 205, a placement guide is aligned to a module substrate and in step 210 the module substrate and placement guide are temporarily (clamped/glued) or permanently (glued or bonded) attached so as not to be able to move during the integrated circuit chip to module substrate bonding operation of step 235. In step 215, the integrated circuit chips are placed the guide openings of the placement guide. The method then continues with step 235.

In step 220, the integrated circuit chips are placed on a module substrate and in step 225 a placement guide is placed on the module substrate, the guide openings are rough-aligned to the integrated circuit chips and fine aligned to the module substrate. In step 230, the module substrate and placement guide are temporarily (clamped/glued) or permanently (glued or bonded) attached so as not to be able to move during the integrated circuit chip to module substrate bonding operation of step 235. The method then continues with step 235.

In step 235, the integrated circuits are bonded to the module substrate. For copper-to-copper bonding, heat and pressure are applied under an inert or inert/reducing atmosphere. For solder bump connections, heat is applied to reflow the solder bumps (optionally under an inert or inert/reducing atmosphere). For solder bump attachment, flux may or may not be applied prior to or after placing the integrated circuit chip on the module substrate or during joining. Depending on flux, the assembly may require post assembly cleaning. No clean fluxes may be deployed or controlled ambient gas during joining to enhance joining without post-assembly cleaning.

In step 240, the placement guide is optionally removed and in step 245 the module substrate is singulated into single-chip, multi-chip or both single and multi-chip module substrates. In step 250, the handle substrate may optionally be removed. Optional testing may be performed immediately after steps 235, 245 and 250.

Thus, the embodiments of the present invention provide methods of precision attachment of integrated circuit chips to module substrates.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating an electronic device, comprising:

Placing a placement guide over a top surface of a module substrate, a bottom surface of said placement guide facing a top surface of said module substrate, said placement guide having one or more guide openings, said guide openings extending from a top surface of said placement guide to said bottom surface of said placement guide;

aligning said placement guide to at least one integrated circuit chip position of one or more integrated circuit chip positions on said module substrate;

fixing said aligned placement guide to said module substrate;

placing one or more integrated circuit chips in corresponding guide openings of said one or more guide openings, bottom surfaces of said one or more integrated circuit chips facing said top surface of said module substrate, each integrated circuit chip of said one or more integrated circuit chips having first distances between sidewalls of said placement guide openings and corresponding sidewalls of each integrated circuit chip of said one or more integrated circuit chips, said first distances constraining electrically conductive bonding structures on bottom surfaces of each integrated circuit chip of said one or more integrated circuit chips to contact corresponding electrically conductive module substrate contact pads on said top surface of said module substrate;

bonding said bonding structures to said module substrate contact pads, said bonding structures and said module substrate contact pads in direct physical and electrical contact after said bonding; and wherein a distance between at least one sidewall of each of said one or more placement guide openings and at least one opposing sidewall of corresponding placed integrated circuit chips is equal to less than one half a distance between centers of a pair of adjacent module substrate contact pads of said module substrate contact pads at each of said corresponding integrated circuit chip positions.

2. The method of claim 1, further including:
after said bonding, removing said placement guide from said module substrate.

3. The method of claim 2, further including:
singulating said module substrate into individual modules, each module substrate containing one or more integrated circuit chips.

4. The method of claim 1, wherein said bonding structures are solder bumps on chip contact pads and said bonding creates a soldered connection between said chip contact pads and said module substrate contact pads.

5. The method of claim 1, wherein said bonding structures comprise copper chip contact pads, said module substrate contact pads comprise copper and said bonding creates a copper to copper weld between said chip contact pads and said module substrate contact pads.

6. The method of claim 1, wherein said placement guide comprises silicon, said integrated circuit chip comprises silicon, and said module substrate comprises silicon.

7. The method of claim 1, further including:
attaching a handle substrate to a bottom surface of said module substrate.

8. The method of claim 1, wherein corresponding center to center spacing of adjacent module substrate contact pads of at least two of said one or more integrated circuit chip positions is different.

9. The method of claim 1, wherein said integrated circuit chip is placed on said module substrate after said aligning and fixing said placement guide to said module substrate.

10. The method of claim 1, wherein said placing said integrated circuit chip on said module substrate is performed before said aligning and fixing said placement guide to said module substrate.

11. The method of claim 1, further including:
after said bonding, removing said placement guide from said module substrate; and
after said removing said placement guide, singulating said module substrate into individual modules, each module containing one or more integrated circuit chips.

12. The method of claim 1, further including:
singulating said module substrate into individual modules, each module substrate containing one or more integrated circuit chips.

13. The method of claim 1, wherein at least one of said one or more integrated circuit chips includes an additional integrated circuit chip stacked on top of and electrically connected to said at least one of said one or more integrated circuit chips.

14. The method of claim 1, wherein first distances from said top surface of said module substrate to respective top surfaces of each integrated circuit chip of said one or more integrated circuit chips are less than a second distance between a top surface of said placement guide and said bottom surface of said placement guide, said first and second distances measured perpendicular to said top surface of said module substrate.

15. The method of claim 1, wherein first distances from said top surface of said module substrate to respective top surfaces of each integrated circuit chip of said one or more integrated circuit chips are greater than a second distance between a top surface of said placement guide and said bottom surface of said placement guide, said first and second distances measured perpendicular to said top surface of said module substrate.

* * * * *